(12) United States Patent
Angel, Jr.

(10) Patent No.: US 10,425,717 B2
(45) Date of Patent: Sep. 24, 2019

(54) AWARENESS INTELLIGENCE HEADPHONE

(71) Applicant: SR Homedics, LLC, Commerce Township, MI (US)

(72) Inventor: Donald Earl Angel, Jr., Foster City, CA (US)

(73) Assignee: SR HOMEDICS, LLC, Commerce Township, MI (US)

( * ) Notice: Subject to any disclaimer, the term of this patent is extended or adjusted under 35 U.S.C. 154(b) by 0 days.

(21) Appl. No.: 14/616,506

(22) Filed: Feb. 6, 2015

(65) Prior Publication Data

US 2015/0222977 A1  Aug. 6, 2015

Related U.S. Application Data

(60) Provisional application No. 61/936,817, filed on Feb. 6, 2014.

(51) Int. Cl.
| | |
|---|---|
| *H03B 29/00* | (2006.01) |
| *A61F 11/06* | (2006.01) |
| *G10K 11/16* | (2006.01) |
| *H04R 1/10* | (2006.01) |
| *H03G 5/16* | (2006.01) |

(52) U.S. Cl.
CPC .......... *H04R 1/105* (2013.01); *H04R 1/1083* (2013.01); *H03G 5/165* (2013.01); *H04R 1/1041* (2013.01); *H04R 2420/01* (2013.01); *H04R 2460/01* (2013.01); *H04R 2499/11* (2013.01)

(58) Field of Classification Search
CPC .... H04R 5/04; H04R 1/1083; H04R 2460/01; H04R 1/105; H03G 5/165; G10L 25/48

USPC ............ 381/56, 58, 103, 71.6, 74, 57, 71.4; 455/569, 557, 575, 550, 556; 704/273, 704/244, 275, 202
See application file for complete search history.

(56) References Cited

U.S. PATENT DOCUMENTS

| | | | | |
|---|---|---|---|---|
| 8,023,663 | B2* | 9/2011 | Goldberg | G10H 1/0025 381/373 |
| 8,315,876 | B2* | 11/2012 | Reuss | G10L 17/24 700/175 |
| 2002/0141597 | A1* | 10/2002 | Wilcock | G06F 3/167 381/61 |
| 2004/0242278 | A1 | 12/2004 | Tomoda et al. | |
| 2007/0223717 | A1* | 9/2007 | Boersma | H04M 1/6058 381/74 |
| 2010/0179812 | A1* | 7/2010 | Jang | G10L 15/065 704/244 |
| 2011/0054907 | A1* | 3/2011 | Chipchase | H04M 1/6066 704/275 |
| 2012/0114132 | A1* | 5/2012 | Abrahamsson | H04R 1/1016 381/74 |
| 2013/0238341 | A1* | 9/2013 | You | G10L 25/48 704/275 |

(Continued)

*Primary Examiner* — Paul Kim
*Assistant Examiner* — Ubachukwu A Odunukwe
(74) *Attorney, Agent, or Firm* — Brooks Kushman P.C.

(57) ABSTRACT

Methods and systems are provided for an awareness intelligence headphone with an always listening mode. Headphone units share the ability to output audio sound to a user, but may not provide additional functionality that users may require. A headphone unit with the always listening mode is used to analyze ambient noise surrounding the headphone unit in order to detect predetermined sounds, issue alerts to a user, and respond to an input command from the user.

20 Claims, 6 Drawing Sheets

(56) References Cited

U.S. PATENT DOCUMENTS

| | | | |
|---|---|---|---|
| 2014/0044269 A1* | 2/2014 | Anderson | H04R 5/04 381/57 |
| 2014/0072154 A1* | 3/2014 | Tachibana | H04R 5/033 381/309 |
| 2014/0185828 A1* | 7/2014 | Helbling | H03G 5/165 381/103 |

* cited by examiner

AWARENESS INTELLIGENCE HEADPHONE

CROSS REFERENCE TO RELATED APPLICATIONS

This application claims priority to U.S. Provisional Patent Application No. 61/936,817, entitled "AWARENESS INTELLIGENCE HEADPHONE", filed Feb. 6, 2014, the entire contents of which are hereby incorporated by reference for all purposes.

FIELD

The present application relates generally to systems and methods for an awareness intelligence headphone with always-on listening functionality and voice recognition.

SUMMARY/BACKGROUND

A headphone unit, or headphones, is a personal audio listening accessory that can be connected to an audio output device for a user to listen to audio playback. Audio output devices may include computers, portable media players, mobile phones, and many other similar devices. As compared to large speaker systems that are stationary, headphone units are highly portable and can be carried with a person throughout his or her daily activities. Additionally, headphone units, although not able to produce the sound of stationary speaker systems, are able to produce adequate sound to enable a pleasurable listening experience for a mobile user.

With the advancement of technologies that can be incorporated in mobile devices such as smartphones, similar technology can be incorporated into headphone units. Headphone units, regardless of type or manufacturer, share the basic functionality of converting electrical audio signals into sound pressure waves via one or more speakers and directing those sound pressure waves to a user of the headphone unit. As other mobile technology such as mobile phones have increased in functionality, headphones may also become more advanced and increase their utility to a user.

Some headphone units may be equipped with active noise-cancellation, wherein ambient noise surrounding the headphones is blocked from being passed through the speakers of the headphones. Typically, while the active noise-cancellation is occurring, a user of the headphones is simultaneously receiving audio input from an audio device (e.g., listening to music from a portable music device). The noise-cancellation function allows the user to listen to his or her music at a lower volume and/or in a relatively noisy environment. However, noise-cancellation, particularly when coupled with audio input, such as music being passed through the speakers of the headphones, may isolate the user from his or her environment.

The inventors herein have recognized the above issue and provide an approach to at least partly address it. In one embodiment, a method for an always listening function of a headphone unit comprises analyzing ambient noise surrounding the headphone unit; upon detection of a predetermined sound, executing an alert to a user of the headphone unit; and manipulating audio playback following an input command received from the user in response to the alert. In this way, the user may be alerted of the predetermined sound even when a noise cancellation system is active and/or while receiving audio input from an audio device.

In one example, the method may detect and analyze the predetermined sound, such as a user's name, a voice above a volume threshold, sound from a siren, or horn. Responsive to the detection of the predetermined sound, the user may be provided with an alert, such as a pause or decrease in volume in the audio playback being passed through the speakers. The user may input a command in response to the alert, indicating whether he or she wishes to respond to the predetermined sound. For example, if the user wishes to respond to the sound, the user may nod his or her head or issue a voice command (e.g., say 'yes'). As a result, the audio output by the speakers may be paused to allow at least a portion of the predetermined sound and/or ambient noise in the environment to be passed through the speakers.

It should be understood that the summary above is provided to introduce in simplified form a selection of concepts that are further described in the detailed description. It is not meant to identify key or essential features of the claimed subject matter, the scope of which is defined uniquely by the claims that follow the detailed description. Furthermore, the claimed subject matter is not limited to implementations that solve any disadvantages noted above or in any part of this disclosure.

DETAILED DESCRIPTION

Figure 1:
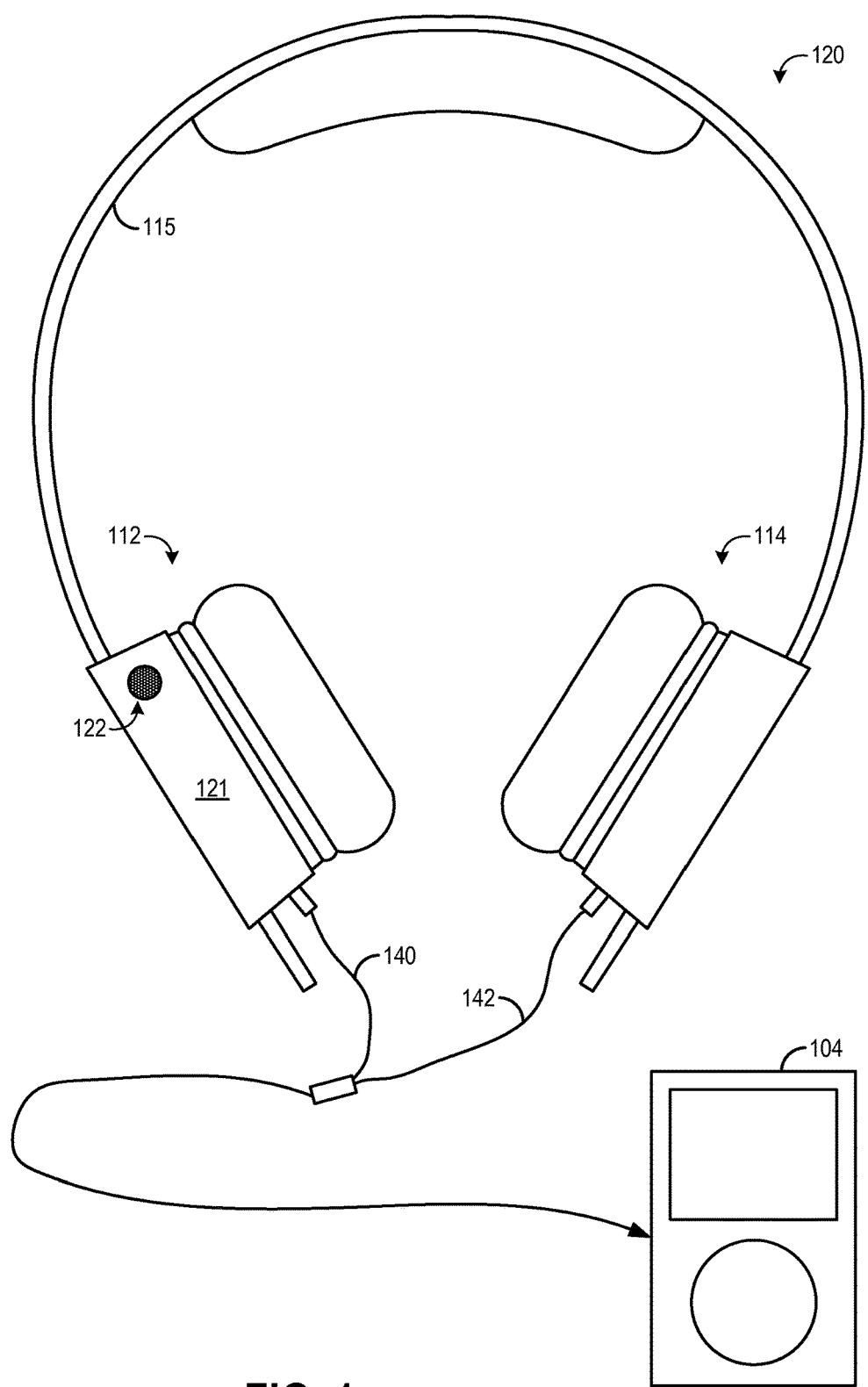
FIG. 1 depicts a headphone unit and other components according to an embodiment of the present disclosure.
Figure 2:
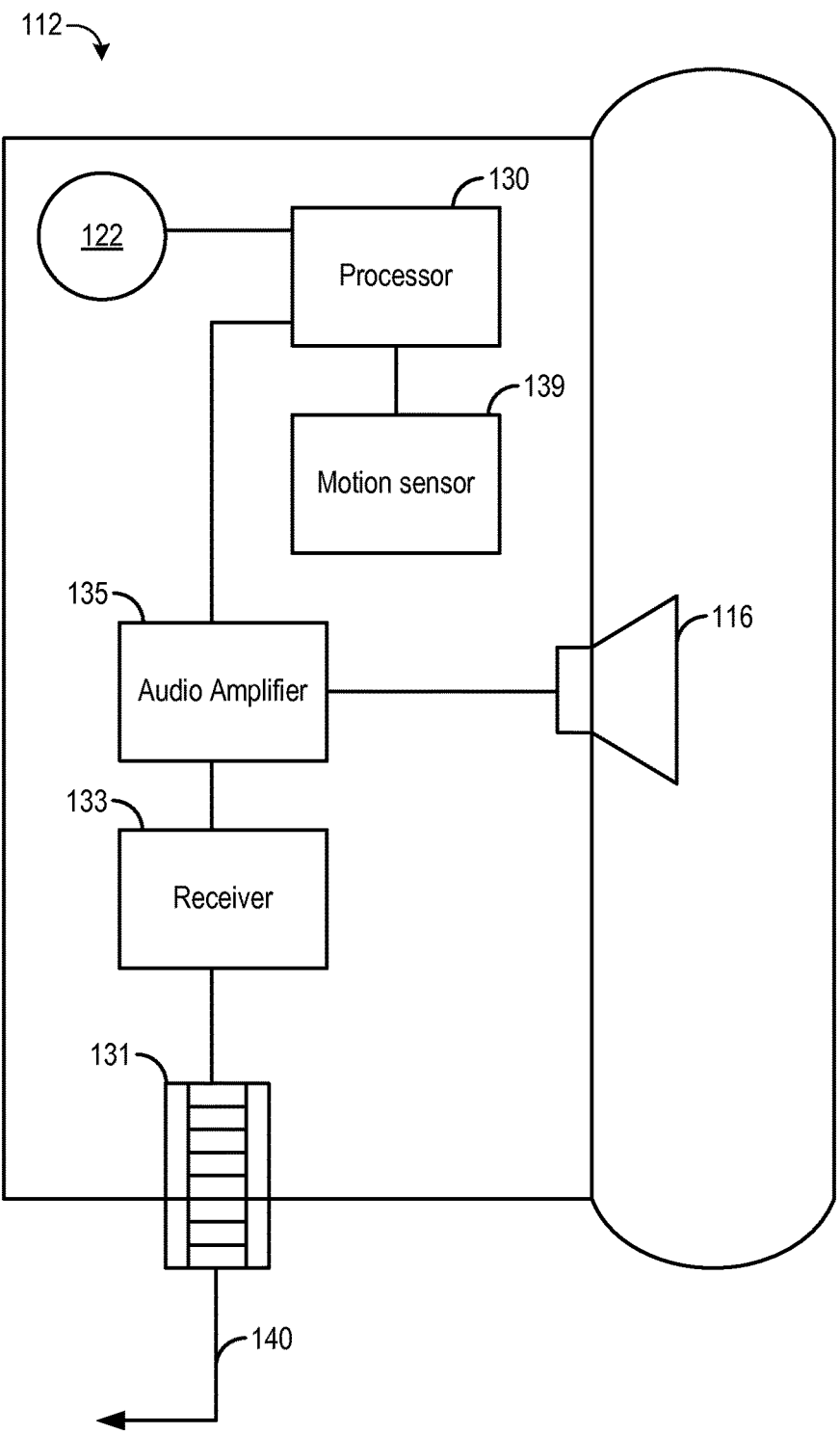
FIG. 2 shows the components contained within an earpiece of a headphone unit according to an embodiment of the present disclosure.

The present disclosure relates to methods and systems for adjusting noise cancellation and/or audio output provided to a user's headphone unit based on conditions in the environment of the user, including detection of a predetermined sound, as well as user command input. In this way, a user may be alerted of particular environmental sound(s) even while listening to audio signals through a set of headphones. FIG. 1 schematically shows an example headphone unit according to an embodiment of the disclosure, while FIG. 2 schematically shows components of an earpiece of the headphone unit of FIG. 1. The example headphone unit may be worn in an example environment, such as example environments shown in FIGS. 3-4. Further, the example headphone unit may be operated according to methods illustrated in FIGS. 5-6.

Now referring to FIG. 1, an audio device 104 may act as a source of audio content (i.e. audio playback) to a headphone unit 120 which can be worn over or in the ears of a user. The audio content provided by the audio device 104 may, for example, be stored on a storage media such as a memory device, an integrated circuit, a CD, a DVD, and the like for playback to the user 102. The audio playback provided by the audio device 104 may include a far-end acoustic signal received over a communications network, such as the speech of a remote person talking into a second audio device. The audio playback may also include acoustic signals being streamed from the storage media, such as a music stream. The audio device 104 may provide the audio playback as mono or stereo acoustic signals to the headphone unit 120 via one or more audio outputs. As used herein, the term "acoustic signal" refers to a signal derived from or based on an acoustic wave corresponding to actual sounds, including acoustically derived electrical signals that represent an acoustic wave.

In the illustrated embodiment, the headphone unit 120 includes a first earpiece 112 positionable on or in a first ear of the user, and a second earpiece 114 positionable on or in a second ear of the user. A connection between first earpiece 112 and second earpiece 114 is made via a headband 115 connecting the two earpieces together. In one example, a position of one of the first earpiece 112 and/or second earpiece 114 may be adjustable by the user or another means to a desired configuration on the user's head. Alternatively, the headphone unit 120 may include a single earpiece. The term "earpiece" as used herein refers to any sound delivery device positionable on or in a person's ear (such as, for example, an ear bud, headphone, or other speaker mechanism).

The audio device 104 may be coupled to the headphone unit 120 via one or more wires, a wireless link, or any other mechanism for communication of information. In the illustrated embodiment, the audio device 104 is coupled to the first earpiece 112 via wire 140, and is coupled to the second earpiece 114 via wire 142. First earpiece 112 may also include an audio input device on an exterior surface 121 of the first earpiece. For use throughout this description, the audio input device may be referred to as a microphone, labeled as microphone 122. It is noted that although not illustrated in FIG. 1, second earpiece 114 may be additionally or alternatively equipped with a similar separate microphone. As such, there may be one or more audio input devices, i.e. microphones 122, located at various locations on a combination of one or both earpieces (e.g., first earpiece 112 and second earpiece 114).

As shown in FIG. 2, the first earpiece 112 includes an audio transducer (e.g., a speaker 116) that generates an acoustic wave proximate the first ear of the user in response to a first acoustic signal. While not illustrated in FIG. 1, the second earpiece 114 may also include an audio transducer which generates an acoustic wave proximate the second ear of the user in response to a second acoustic signal. Each of the audio transducers may, for example, be a loudspeaker or any other type of audio transducer that generates an acoustic wave in response to an electrical signal.

The first acoustic signal may include a desired signal such as the audio content or playback provided by the audio device 104. Moreover, the first acoustic signal may include a first noise reduction signal adapted to cancel undesired background noise, as described in more detail below. Similarly, the second acoustic signal may include a desired signal such as the audio content or playback provided by the audio device 104. The second acoustic signal may also include a second noise reduction signal adapted to cancel undesired background noise. In some alternative embodiments, any combination of the aforementioned signals may be omitted.

An acoustic wave (or waves) may also be generated by noise in the environment surrounding the user. As non-limiting examples, the environment surrounding the user may comprise an environment set outdoors, indoors, in an office setting, in a crowded room, or other environments that include different levels of ambient noise and number of people. The noise may include any sounds coming from one or more locations that differ from the location of the transducers and may include reverberations and echoes. For example, acoustic waves generated by noise in the environment may derive from other people speaking, animal noises (e.g., from a barking dog), street noises (e.g., from motor vehicles), as well as other acoustic signal generating devices (e.g., from televisions, boomboxes, radios, etc.) and the like. The noise may be stationary, non-stationary, and/or a combination of both stationary and non-stationary noise.

As mentioned above, the headphone unit 120 may be configured with an active noise cancellation system to reduce the background (ambient) noise described above. In one example, the active noise cancellation system forms a compensation signal adapted to cancel background noise at a listening position inside each earpiece when the user wears the headphone unit. The compensation signal is provided to each audio transducer (e.g., a speaker) that generates an "anti-noise" acoustic wave. The anti-noise acoustic wave is intended to attenuate or eliminate the background noise at the listening position via destructive interference, so that only the desired audio (that is, the acoustic signals from audio device 104) remains. Consequently, a combination of the anti-noise acoustic wave and background noise at the listening position results in cancellation of both and, hence, a reduction in noise. Microphone 122 may be configured to receive the aforementioned acoustic waves generated by the background noise in order to provide the signal for the active noise cancellation system. In other embodiments, multiple microphones may be placed on both earpieces 112 and 114 for use in the noise cancellation system.

As shown in reference to FIGS. 1-2, a suitable mechanism may be used by the headphone unit 120 to actively cancel ambient noise. In some embodiments, the active noise cancellation system may include the use of analog circuits or digital signal processing. For example, each earpiece may include a processor, such as processor 130. The processor may be configured to execute an algorithm designed to analyze the waveform of the background aural or non-aural noise, and then, based on the specific algorithm, generate a signal that will either phase shift or invert the polarity of the original signal. This inverted signal (in antiphase) is then amplified and each transducer (e.g., speaker) creates a sound wave directly proportional to the amplitude of the original waveform, creating destructive interference. This effectively reduces the volume of the perceivable ambient noise.

In some examples, the active noise cancellation may include feedforward and/or feedback systems. In a feedforward system, the reference microphone 122 may provide a reference signal based on the background noise captured at a reference position. The reference signal is then used by the active noise cancellation system to predict the background noise at the listening position (e.g., user's eardrum) so that the background noise can be cancelled. Typically, this prediction utilizes a transfer function, which models the acoustic path from the reference position to the listening position. Active noise cancellation may then be performed to generate a compensation signal adapted to cancel the noise, whereby the reference signal may be passed through a filter based on the transfer function. In examples where analog circuits are used, the analog circuitry may filter and invert the analog reference signal received from the reference microphone to form an analog compensation signal, which is then provided to the transducer. The compensation signal may then be combined with any audio input signals, such as signals from audio device 104, and amplified by an amplifier, such as audio amplifier 135, and provided as output signals to the transducer (e.g., a driver or speaker). As such, the headphone unit 120 having the active noise cancellation system may use feedback, feedforward, or some combination of the two to generate the anti-noise signals.

Additional components that may be present in the first earpiece 112 are shown in FIGS. 1-2. The first earpiece may contain microphone 122 (or other audio-capturing or audio input device), as discussed above. First earpiece 112 may also comprise an audio transducer, such as a speaker 116 that may be configured to produce audible sound directed towards an ear of the user. An input jack 131 is attached to first earpiece 112 and may partially protrude beyond the earpiece. Input jack 131 is connected to the aforementioned wire 140. Input electrical audio signals may be received via wire 140 and input jack 131, in the case of headphone unit 120 being a wired unit as compared to a wireless unit. Furthermore, wire 140 may provide power for headphone unit 120. Microphone 122 may be located on a surface of and/or within first earpiece 112. The microphone may record ambient (background and environmental) noise, as previously described. A receiver 133 may be configured to receiver the input audio signal from the audio device 104, and process the signal further, if necessary. As discussed above, audio amplifier 135 may then manipulate the audio signal and send it to a transducer, such as speaker 116, which then creates the sound pressure waves directed towards the first ear of the user.

Processor 130, which may be configured to execute the active noise cancellation as previously described, is connected to microphone 122 as well as a motion sensor 139. Motion sensor 139 may comprise one or more types of positioning sensors, including accelerometers and gyroscopes. In some embodiments, the components presently described in relation to first earpiece 112 and in reference to all figures of the present disclosure may also be present and functional in second earpiece 114, wherein the two earpieces may contain identical components. Alternatively, only the second earpiece may include all components described in FIGS. 1-2. In another embodiment, first earpiece 112 may be considered a master earpiece while second earpiece 114 may be considered a slave earpiece. In this sense, first earpiece 112 contains all components necessary for processing the audio signal (e.g., audio processing circuitry including receiver 133, audio amplifier 135, and processor 130) while the second earpiece 114 may act as a peripheral speaker. In addition, any adjustments (e.g., volume changes) made to the acoustic signal via input received ion the first earpiece may be automatically applied to the second earpiece. A connection may be made between the first earpiece and second earpiece via headband 115 or an alternative mechanism, such as via wires 140 and 142, to allow communication between the two earpieces.

It is noted that the components shown in FIG. 2 are meant for illustrative purposes and are not to be regarded in a limiting sense. The components may be altered in function and in connection to each other, as well as other components added and/or removed while the headphone still maintains the general function of always listening to its surroundings and manipulating audio playback based on analyzed ambient noise.

According to embodiments disclosed herein, the active noise cancellation system may include one or more "always listening" modes, wherein ambient noise received by the reference microphone (e.g., microphone 122) may be continuously analyzed by the processor (e.g., processor 130) for specific, predetermined sounds. As described later, in reference to FIGS. 3-4, the different always listening modes may be specific to different environments. If one of the predetermined sounds is identified, the active noise cancellation and/or the desired audio content or playback provided by the audio device (e.g., audio device 104) may be interrupted or otherwise manipulated to allow at least a portion of the ambient noise to be passed to the user. In some examples and described in greater detail in reference to FIGS. 5-6, when a predetermined sound is identified, the user may be provided with an alert notifying the user that the predetermined sound has been detected. The user may then issue an input command indicating if he or she wishes to be provided with ambient noise (e.g., by interrupting the noise cancellation and/or by pausing or reducing the volume of the provided audio content or playback) or if he or she wishes to continue with the current level of noise cancellation and provided audio content or playback. In some embodiments, the input command may be a vocal input or cue said by the user. Alternatively, the input command may include a physical cue, such as a head gesture of the user. Such always listening modes may allow the user of the headphone unit to utilize the noise cancellation and/or listen to desired audio playback while simultaneously being able to respond to particular noises in the environment that he or she may want to respond to but may otherwise miss due to the noise cancellation. Example always listening modes are described below with respect to FIGS. 3-4. However, different always listening modes not explicitly described herein may still be embodied in the present disclosure.

Figure 3:
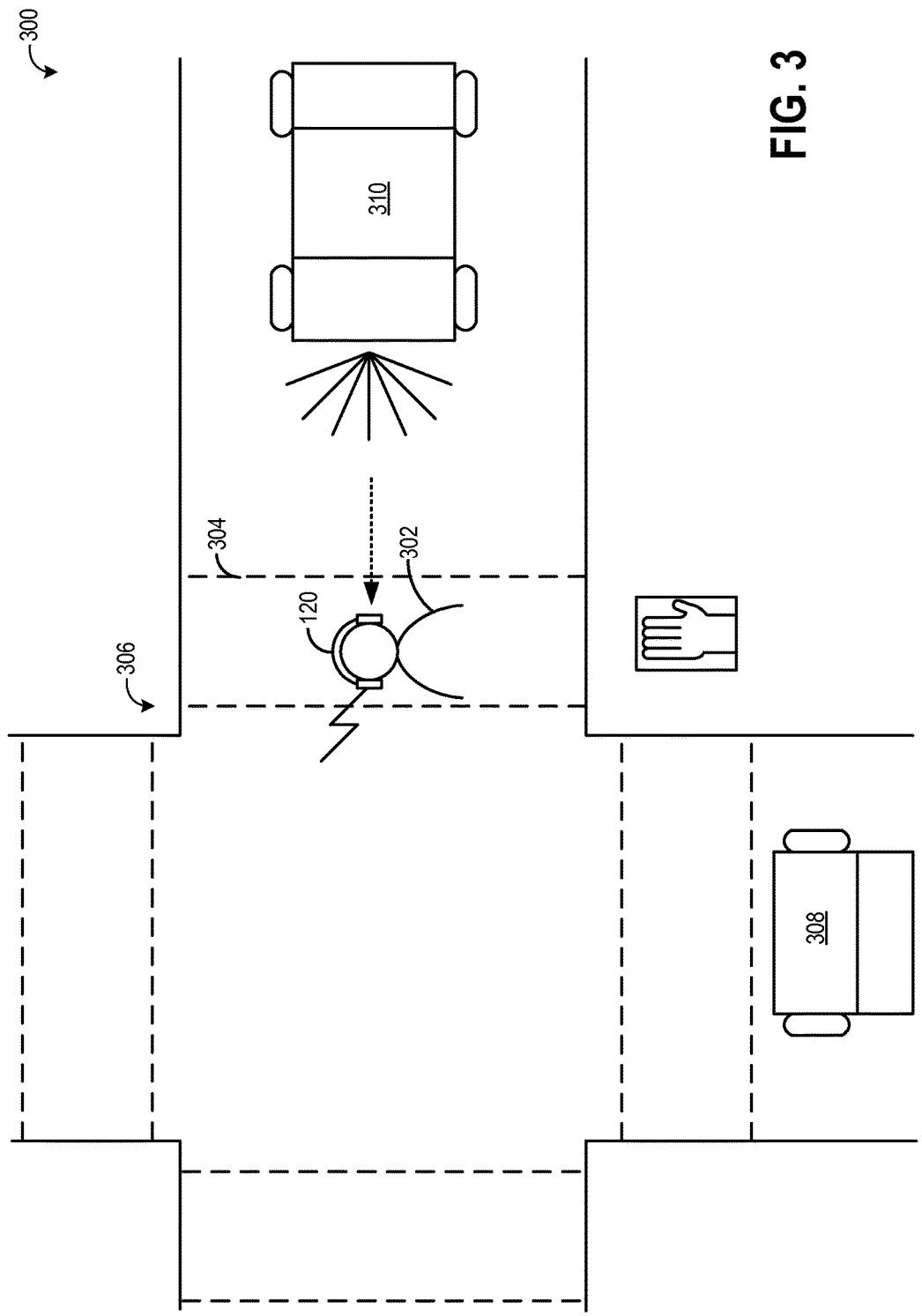
FIG. 3 illustrates a first environment for an always listening mode according to an embodiment of the present disclosure.

Turning to FIG. 3, a first environment 300 for an always listening mode is shown according to an embodiment of the present disclosure. A user 302 is listening to audio content or playback via headphone unit 120. Further, the headphone unit 120 may be operating with active noise cancellation, where the ambient noise in the environment surrounding the headphone unit 120 is blocked from reaching the ears of the user 302. The user 302 may be walking on a crosswalk 304 of a traffic intersection 306. One or more cars 308, or another vehicle such as a bicycle, may also be traveling through intersection 306 and/or may be stopped at stoplights of intersection 306. In the depicted example, an emergency vehicle 310 may be approaching intersection 306. The emergency vehicle 310 may be issuing a siren, horn honk, or other audio indicator that the emergency vehicle intends to cross intersection 306. Due to the active noise cancellation and/or audio content provided to the user 302 through headphone unit 120, the user 302 may not be aware of the emergency vehicle 310 and may be proceeding along crosswalk 304. Such a scenario may not only cause harm to the unaware user 302 but can also delay the emergency vehicle. Thus, a method for an always listening function of a headphone unit may be advantageous to prevent harm to the user and others in the proximate environment. In this example, the always listening function of the headphone unit may enable the user to be alerted as to the emergency vehicle, allowing the user to safely return to the sidewalk while also allowing the emergency vehicle to continue on its path.

In one embodiment, headphone unit 120 may be operating in a first always listening mode wherein the ambient noise is analyzed by headphone unit 120 for one or more predetermined sounds. In this first always listening mode, headphone unit 120 may be configured to identify if the ambient noise exceeds a threshold level, or may be configured to identify a specific set of noises such as those from a siren, horn, or other alert. In one example, the threshold level may be a threshold loudness (e.g., sound wave amplitude), volume or frequency. The first always listening mode may be selected by the user based on a current environment that the user is in, or based on other conditions. For example, when user 302 is walking along a street and navigating intersections, the selected first always listening mode may be configured to notify the user of any noises that indicate potential danger for the user in street or intersection environments (such as vehicle noises, pedestrian crossing signal noises, etc.).

Accordingly, headphone unit 120 may analyze the ambient noise in the environment, such as the first environment, around the headphone unit 120 (for example, by processing the acoustic signals received by the reference microphone or microphones). In the first always listening mode, based on the selection, the processing at the headphone unit may include processing sounds in a first frequency range, first amplitude range, first volume range, etc. Herein, the first frequency/amplitude/volume range may vary based on whether the first environment is a street intersection, an office, a classroom, etc. With reference to the depicted example of FIG. 3, the headphone unit 120 may receive and identify the siren being issued from emergency vehicle 310 (e.g., based on the user selecting a traffic environment). Upon identifying the siren based on the siren noise exceeding a pre-determined threshold level, the headphone unit 120 may issue an alert to the user 302, for example, by pausing, reducing the volume, or otherwise manipulating the audio content or playback being provided to the user 302 via the speakers 116 of the headphone unit 120. In other examples, the alert may alternatively or additionally include interrupting active noise cancellation and/or issuing an audio alert (e.g., a pre-recorded sound, verbal notification, or other alert). In another example, another form of alert may be possible, such as a vibrational alert or adjustments to a power supplied to the headphone unit 120. In still other examples, the alert may include the active noise cancellation being temporarily disabled so that the ambient noise is transiently allowed to be heard by the user. Herein, when the ambient noise is sufficiently high, a sample of the ambient noise is automatically and transiently provided to the user via the headphone unit.

Responsive to the alert, the user 302 may input a command to the headphone unit 120 to respond to or ignore the alert. For example, the user may nod his or her head or issue a voice command (by saying the word 'yes', for example, or the word 'pause') indicating he or she wants to respond to the alert. In some embodiments, headphone unit 120 may include a motion sensor (accelerometer, gyroscope, etc.) to detect a change in position of the user's head. In another example, the user may shake his or her head back and forth or issue a different voice command (e.g., say "no" or "play") if the user wishes to ignore the alert. In this way, the user may be made aware of various conditions and environments that may require immediate attention while maintaining control of audio playback of headphone unit 120.

If the user input command indicates the user is responding to the alert, the headphone unit 120 may interrupt or pause noise cancellation and/or audio playback from the audio device so that the ambient noise may be passed to the user. In one embodiment, interrupting audio content or playback from the audio device may comprise adjusting a volume, or pausing the provided audio content. The ambient noise may be continually passed to the user until another user input is received indicating that the user wants the active noise cancellation to be resumed. Alternatively, the ambient noise may be passed to the user for a predefined amount of time (such as an amount of time required for a user to safely traverse a pedestrian crosswalk). Further still, if the user indicates that they wish the ambient noise to be passed to them, the noise may continue to be passed as long as the noise is above the threshold level. When the ambient noise level drops below the threshold level, the active noise cancellation may be automatically resumed. In this way, the user may determine where the siren, for example, is coming from and decide if he or she needs to alter his or her actions in response to an emergency vehicle emitting a siren (by retreating from the crosswalk, for example, until the emergency vehicle passes).

While the first always listening mode described above alerts the user and waits for the user to respond to the alert, in some embodiments the first always listening mode may automatically interrupt noise cancellation and/or reduce the volume or pause the provided audio content or audio playback without issuing an alert to the user. For example, if the headphone unit 120 detects a pre-determined sound, such as a siren or horn, the headphone unit 120 may immediately interrupt noise cancellation and/or reduce the volume or pause the provided audio content or audio playback without issuing an alert to the user. In this way, the user may be notified of potential danger as quickly as possible.

Figure 4:
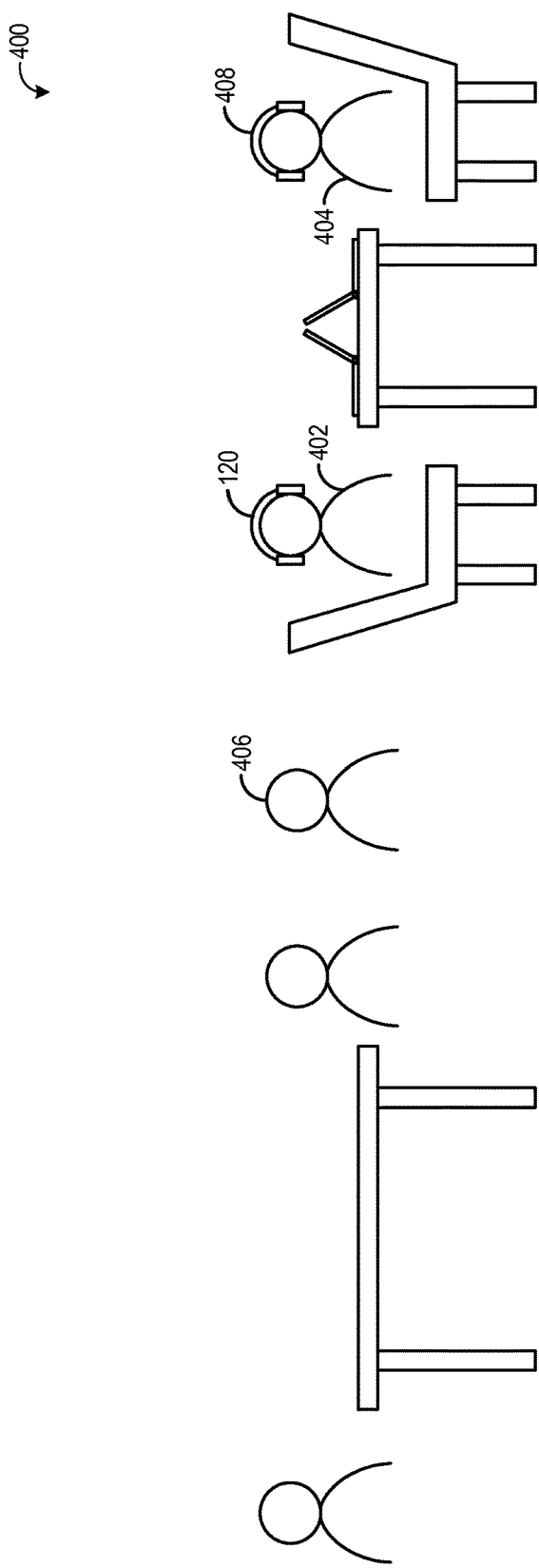
FIG. 4 illustrates a second environment for an always listening mode according to another embodiment of the present disclosure.

FIG. 4 illustrates an example second environment 400 for an always listening mode according to another embodiment of the present disclosure. A first user 402 is listening to audio content or audio playback via headphone unit 120. Further, the headphone unit 120 may be operating with active noise cancellation, where the ambient noise in the environment surrounding the headphone unit 120 is at least partially blocked from reaching the ears of user 402. Similarly, a second user 404 is listening to audio content or playback via a second headphone unit 408, which may be similar in function and/or form to headphone unit 120. Further, headphone unit 408 may be operating with active noise cancellation, where the ambient noise in the environment surrounding the headphone unit 408 may be at least partially blocked from reaching the ears of the user 404. In an example, first user 402 and second user 404 may be studying or otherwise working in a relatively quiet setting, such as a library, classroom, conference room, or office setting. Further, one or more additional people, represented as person 406 in this example, may also be present in second environment 400.

In one example, headphone unit 120 and headphone unit 408 may each be operating in a second always listening mode. The second always listening mode may include a semi-ambient mode where the first user 402 and the second user 404 can listen to music or other audio content via his or her respective headphone units, while concomitantly having a portion of the ambient noise passed to one or more of the first user's and second user's ears. For example, each headphone unit may analyze the ambient noise surrounding his or her respective headphone unit to identify a voice speaking at or above a threshold level, such as normal conversational volume level. In another example, the threshold level may be slightly and/or moderately higher or lower in volume than normal conversation volume depending on user input. The identified voice being at or above said threshold volume may be passed through the speakers of the headphone unit (e.g., headphone units 102 and/or 408), while other ambient noise in the background may be cancelled. This may allow the first and second users to carry on a conversation while listening to music or other audio content provided by the audio device (e.g., audio device 104). In some examples, when the identified voice is recognized by the headphone unit, the playback of the audio content may also be manipulated (e.g., the volume lowered or muted). Further still, as explained above, the headphone unit may issue an alert to the user before passing a portion of the ambient noise to the user and/or manipulating playback of the provided audio content. In still further embodiments, voice recognition may be utilized by the headphone unit so that only the voice of a selected user is passed through the headphone unit. For example, if the second user 404 is talking and an additional person (such as person 406) in the environment is also talking at a threshold volume detectable by the headphone unit 120 of the first user 402, voice recognition may be performed to identify the voice of the second user 404 and pass only the voice of the second user 404 through the speakers of the headphone unit 120 to first user 402. As a result, undesirable background noise, such as ambient noise from additional person(s) and/or other noise-generating animals or objects, may be adequately prevented from reaching the first or second user, thereby enabling limited and controlled sound to pass the headphone unit (e.g., headphone units 102 and/or 408). In this way, desired conversations may still be carried out between users wearing the headphone unit(s) in the second always listening mode.

Thus, in one example, a method for an always listening function of a headphone unit comprises analyzing ambient noise surrounding the headphone unit; upon detection of a voice above a threshold volume in the ambient noise, allowing the voice to pass through a speaker of the headphone unit to a user of the headphone unit; simultaneously continuing audio content or playback through the speaker while allowing the voice to pass through to the user via the speaker; and discontinuing the allowing the voice to pass through the speaker following an input command by the user. In one embodiment, the input command may be delivered to the speaker having appropriate devices for receiving input commands (such as a microphone and/or a motion sensor).

With reference to the example of FIG. 4, the threshold level may be at, above, or near a volume level of a voice of a person talking in a conversational setting. In this way, not all ambient noise passes through the speaker to the user of the headphone. In one embodiment, the input command that may discontinue, or block passage of, the voice passing through to the user may include a head gesture quantified by motion sensor 139, or vocal input picked up by microphone 12, both shown in reference to FIG. 2. Moreover, the input command may additionally or alternatively comprise a pre-determined time duration during which there is no detected voice at or above the threshold volume level. In this example, if the voice having a volume level at, above or near the threshold level is no longer detected during the pre-determined time duration, then the speaker, e.g., speaker 116, may be switched back to a mode wherein no detected voice may be allowed to pass through the speaker. In an example, the pre-determined time duration(s) may be determined by user input or default manufacturer's settings. Moreover, in one embodiment, the user may be allowed to adjust a balance between the volume of the audio content or playback and the perceived voice volume through the headphone unit in order to create a pleasurable listening experience.

In another embodiment, first user 402 may select a third always listening mode for the headphone unit 120 wherein the ambient noise surrounding the headphone unit 120 may be analyzed for a predetermined sound. For example, the third always listening mode, the predetermined sound may include a voice issuing the user's name. As such, if another person in the environment, such as person 406, calls out the name of the first user 402, headphone unit 120 may identify the user's name in the ambient noise and issue an alert to the first user 402, interrupt noise cancellation, and/or manipulate playback of the audio content. Herein, if person 406 instead calls out the name of user 404, the active noise cancellation of user 402 remains unchanged. In this way, the first user 402 may recognize that another person in the environment is attempting to speak or interact with the first user 402, even when the first user 402 is listening to audio content or playback, in the presence or absence of active noise cancellation.

Thus, in an embodiment, a method for an always listening function of a headphone unit comprises analyzing ambient noise surrounding the headphone unit; upon detection of a pre-determined sound, executing an alert to a user of the headphone unit; and manipulating audio playback following an input command by the user in response to the alert.

In an embodiment, the pre-determined sound may comprise a name of the user, a greeting (e.g., hello or hi), a specific phrase (e.g., excuse me), a siren, a horn, other sound(s) that represent danger, or a combination thereof. In one example, the pre-determined sound may be determined and input by the user and/or selected from a range of pre-determined or pre-recorded sounds programmed in the headphone unit by a manufacturer of the headphone unit. In other examples, the pre-determined sounds may include one or more other sounds not explicitly described herein. Further still, the user may select and download a plurality of sounds onto the headphone unit from a library of sounds (provided by the manufacturer, for example). The user may also upload a plurality of sounds (e.g., recorded sounds) to the library.

The alert to the user following detection of the pre-determined sound may comprise pausing audio playback, directing ambient noise through a speaker of the headphone unit to the user, or a combination thereof. In another example, the alert may include reducing a volume of audio playback. In yet another example, active noise cancellation may be paused or reduced. Subsequently, once the user has been alerted, the user may execute the input command to the speaker, which may include one of a head gesture of the user and a vocal input. In an embodiment, the speaker includes the appropriate devices for receiving input commands (such as a microphone and/or a motion sensor). The execution of the input command by the user may manipulate audio playback, for example, by pausing audio playback or, alternatively, continuing audio playback uninterrupted.

Figure 5:
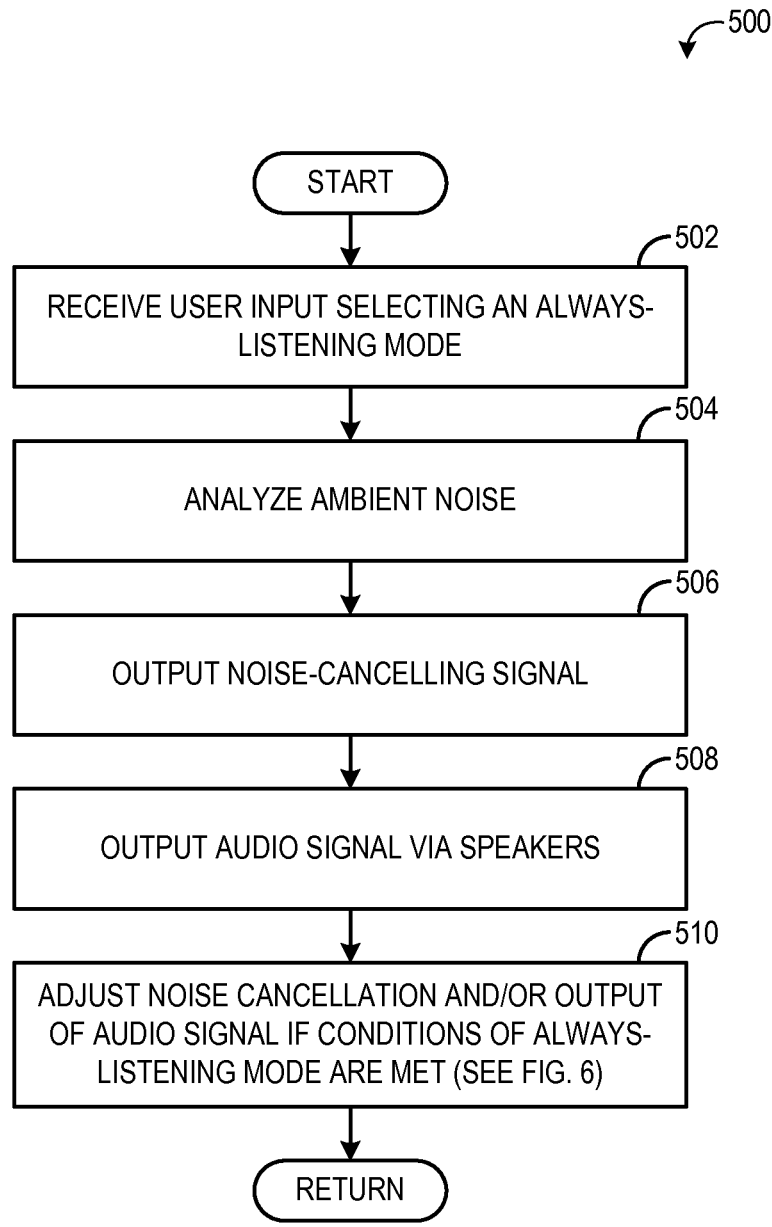
FIG. 5 shows an example method for operation of a headphone unit with an always listening mode according to an embodiment of the present disclosure.

Now turning to FIG. 5, a method 500 shows an example operation of a headphone unit, such as headphone unit 120 of FIGS. 1-2, in one example always listening mode. As described above, different always listening modes may be specific to different environments. The processor of the headphone unit, for example, processor 130 of FIG. 2, may perform method 500. In an example, the headphone unit may be worn over or in the ears of a user, and comprise at least components enabling processing and outputting the audio signal (e.g., audio processing circuitry including receiver 133, audio amplifier 135, speaker 116, and processor 130).

Method 500 may begin at 502, wherein the headphone unit may receive user input in selecting one of an always listening mode, for example, the first, second, and/or third always listening modes. As described above in reference to FIGS. 3-4, the different always listening modes may be specific to different environments. As such, ambient noise received by the microphone may be continuously analyzed by the processor for specific, pre-determined sounds, as previously described. Alternatively, a user may select a different mode, upon which method 500 may not apply, and, thus, method 500 may end. Next, at 504, the headphone unit may analyze the ambient noise, wherein noise and sounds are received via a microphone (e.g., microphone 122) and processed by a processor (e.g., processor 130). In one example, the analysis of the ambient noise at 504 may be based on the selection made at 502. For example, based on user input indicative of a selected always listening mode (e.g., a first mode, a second mode, etc.), a volume range, frequency range, etc. of the ambient noise that is analyzed may vary. For example, a higher volume threshold (and/or frequency threshold) may be applied when the always on listening mode corresponds to a traffic junction environment (so as to capture siren noises more accurately) while a lower volume threshold (and/or frequency threshold) may be applied when the always on listening mode corresponds to a classroom or office environment (so as to capture human voices more accurately). Further, to enhance audio playback quality and clarity to the user, a noise-cancelling signal may be outputted via the active noise-cancellation system at 506. In one example, the output of the noise-cancelling signal occurs concurrently with the analysis of the ambient noise at 504. The presence of the active noise-cancellation system may enable a more enjoyable audio experience for the user of the headphone unit. At 508, an audio signal as received by an external audio device, e.g., audio device 104 of FIG. 1, may be output to the ears of a user via headphone speaker(s), e.g., speakers 116. Accordingly, in one embodiment, output of the audio signal by the audio device at 508 may also occur concurrently with the output of the noise-cancelling signal at 506 and the analysis of the ambient noise at 504. In some examples, the audio signal may include musical sounds, other sounds such as radio broadcasts, podcasts, talk radio, news programs, audio books, and/or other audio sounds. Finally, at 510, if one or more conditions of the always listening mode are met, adjustments are made to the noise-cancellation and/or the output of the audio signal or playback to the speakers. Further description of the aforementioned one or more conditions, adjustments and related methods are shown in FIG. 6 and described hereafter.

Figure 6:
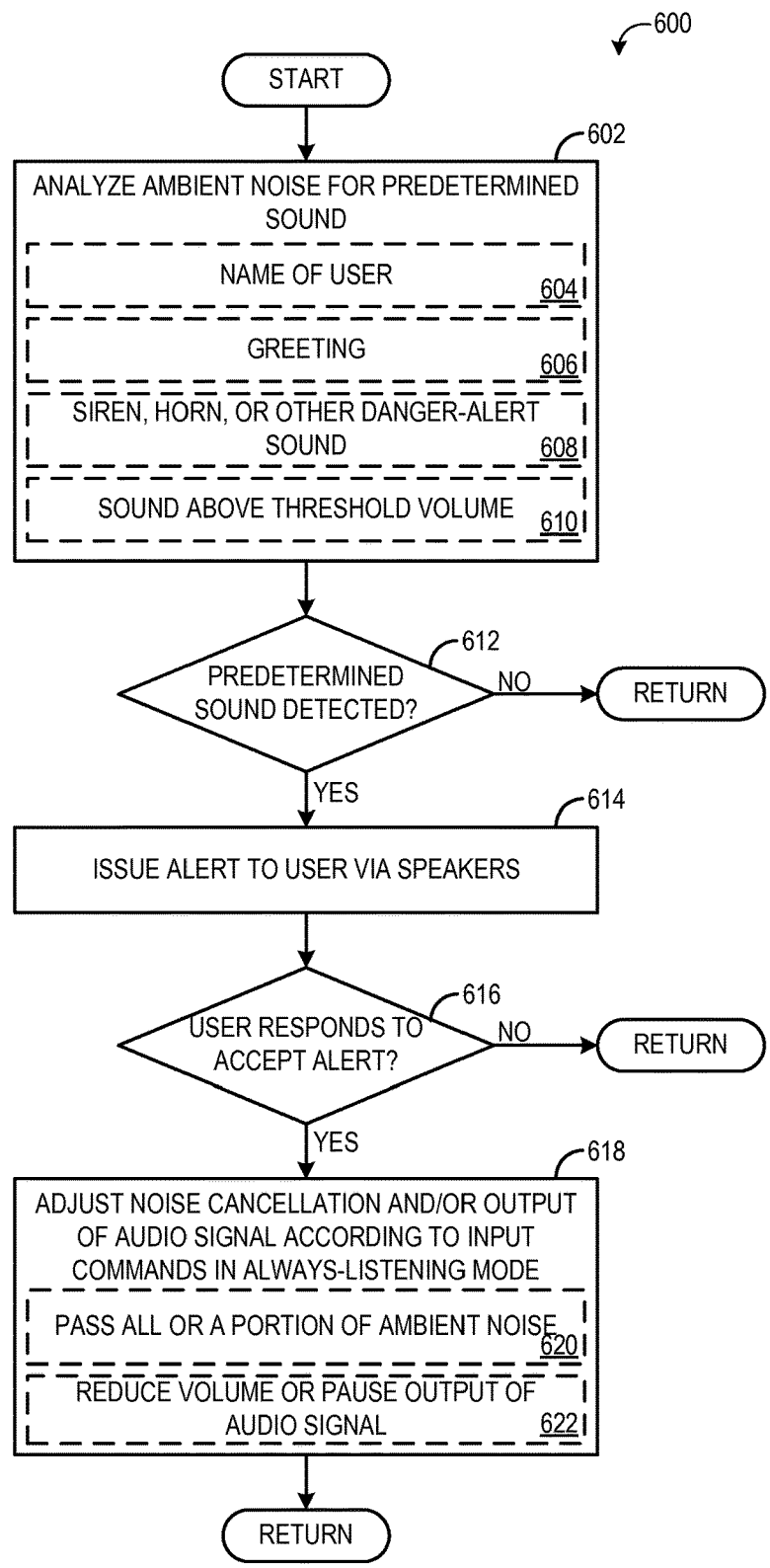
FIG. 6 shows an example method for operation of an always listening mode of a headphone unit according to an embodiment of the present disclosure.

FIG. 6 shows a method 600 depicting an example operation of analyzing ambient noise and adjusting output of audio playback based on one or more conditions, including detection of one or more pre-determined sounds. The method 600 of FIG. 6 may be performed by a processor of the headphone unit, e.g., headphone unit 102. The method 600 may begin at 602, wherein ambient noise surrounding a headphone unit may be analyzed for pre-determined sound. The pre-determined sound may include, but is not limited to, a name of the user 604, another name or title chosen by the user, a conventional greeting 606 (e.g. 'hello' or 'how are you?'), a danger alert sound 608 such as a siren or a horn, or a sound above a threshold volume level 610. Alternatively, in another embodiment, the headphone unit may utilize voice recognition so that only a voice of a selected person is passed through the headphone unit. Thus, the headphone unit may only pass the voice of the selected person through the speakers of the headphone unit 120 to the user. At 612, if a predetermined sound is not detected, then method 600 ends. However, if a predetermined sound is detected (such as a name of the user), at 614 an alert is issued to the user via the headphone speakers through a first and/or second earpiece (e.g., first earpiece 112 and/or second earpiece 114) of the headphone unit. In some examples, the alert may include a sound, manipulation of the audio playback, manipulation of the active noise-cancellation, or a combination thereof. For example, the alert may first issue a sound, such as a beep, and then reduction in a volume of the audio playback. In another example, the sound serving as the alert may be different than the pre-determined sound, such as a bell chime. In yet another example, the alert may comprise of reduction in a volume of the audio playback and a simultaneous deactivation of the active-noise cancellation system. Next, at 616, the user may respond to the alert. If the alert is denied, then the audio playback resumes as normal, and no other manipulation of the audio playback occurs and the method ends. In an example, denial of the alert by the user may comprise ignoring to issue an input command for a pre-determined time duration, and/or inputting a pre-set ignore or deny command, such as a gesture such as shaking of the user's head side to side or saying 'no'. Conversely, if the user accepts the alert, at 618 the noise-cancelling signal produced by the noise-cancellation system and/or output of the audio signal may be adjusted according to the input commands for the chosen always listening mode. In some examples, the input commands for each of an always listening mode may be set by the user selecting from pre-programmed options made by a manufacturer of the headphone unit. In other examples, the input commands may be programmed and set by the user based on the pre-determined sound. For example, if the pre-determined sound in a particular always listening mode is the name of the user, a nod by the user's head may serve as the input command to accept the alert.

In one embodiment, the input command that may pass all or only a portion of ambient sound, noise, or voice through to the user may include a head gesture quantified by a motion sensor (e.g., motion sensor 139 of FIG. 2), and/or vocal input delivered by the user and picked up by a microphone (e.g., microphone 122 of FIG. 2). In other examples, the input command may additionally or alternatively include, for example, a pre-determined time duration during which there is no detected sound, a name of user 604, greeting 606, siren, horn or other danger-alert sound 608, and/or sound at or above a threshold value 610. Thus, at 620, all or a portion of the ambient noise may be passed through the speaker to the user depending on a specific input command for a particular always listening mode. Alternatively or additionally, a volume of the audio playback (audio signal or content) may be reduced or paused at 622. In this example, reducing the volume of, or pausing the audio playback may be useful when a second person may want to communicate with the user of the headphone unit, or when the user is in a potentially dangerous situation. Other embodiments may change the specific structure of method 600 while maintaining the same general concept of always listening to ambient noise and performing a series of commands based on user input and a number of predetermined settings.

It is noted that manipulating audio playback may include altering the audio signal output by the speakers, wherein the volume of the audio signal is changed or the audio signal is temporarily stopped, while at the same time the audio device continues to output the audio signal to the headphone unit. In another example, manipulating audio playback may include sending a request to the audio device to reduce the volume of, stop, pause, or otherwise change the audio signal. As the audio device may include processing power along with the headphone unit, the headphone unit may include instructions for manipulating the audio signal by itself or in conjunction with the audio device.

As the headphone unit contains the processor configured to analyze ambient sound, ambient sound surrounding the headphone unit is the primary concern for the processor. If the audio device, for example, were equipped with the always listening mode, then the sound analyzed by the device may be different from the sound surrounding the headphone unit. This discrepancy could cause a delay or otherwise incorrect manipulation in the audio output of the headphone unit. As an example, if the always listening audio device were in a user's pocket, a sound produced by rubbing between the pocket and the audio device could be mistaken for the predetermined sound and an alert would be incorrectly issued to the user. In this way, providing the always listening mode in the headphone unit may be more conducive to the needs of a user.

In a similar situation wherein the audio device is equipped with the always listening mode (rather than with the headphone unit), if the headphone unit were disconnected from the audio device and connected to a different audio device that did not include the always listening mode, then the features described herein would be unavailable. With the proposed headphone unit incorporating the always listening functionality, the features of the always listening mode would be available regardless of the external audio device that provides the audio signal. Furthermore, as the headphone unit is worn on the head of the user, providing head gestures to respond to alerts may be easier than a user needing to pick up an always listening audio device to input a physical gesture.

Thus, a method for an always listening function of a headphone unit is provided, comprising: analyzing ambient noise surrounding the headphone unit, upon detection of a pre-determined sound, executing an alert to a user of the headphone unit, and manipulating audio playback following an input command by the user in response to the alert. In one example, the pre-determined sound may include a name of the user, a greeting, one or more of a siren, horn, or other sound that represents a danger to the user, or a combination thereof. Further, the alert to the user may comprise pausing audio playback, directing ambient noise through a speaker of the headphone unit to the user, or a combination thereof. In another example, the input command may include one or more of a head gesture of the user and a vocal input by the user. In yet another example, manipulating audio playback may comprise pausing audio playback or continuing audio playback uninterrupted.

In another embodiment, a method for an always listening function of a headphone unit may be provided, comprising: analyzing ambient noise surrounding the headphone unit, blocking passage of the ambient noise to a user of the headphone unit, and upon detection of a sound in the ambient noise exhibiting a volume above a threshold, executing an alert to the user, and allowing ambient noise to pass to the user via a speaker of the headphone unit. Likewise, in one example, the threshold may comprise a volume near or above that emitted by a siren, horn, or other sound that represents a danger to the user. In another example, the alert to the user comprises pausing audio playback, emitting a sound to the user via the speaker of the headphone unit, or a combination thereof. Further, in yet another example, blocking passage of the ambient noise may include cancelling the ambient noise and allowing audio from an input audio signal from an external audio device to pass to the user via the speaker of the headphone unit.

In another embodiment, a method for an always listening function of a headphone unit is shown, comprising: analyzing ambient noise surrounding the headphone unit, upon detection of a voice above a threshold volume in the ambient noise, allowing the voice to pass through a speaker of the headphone unit to a user of the headphone unit, simultaneously continuing audio playback through the speaker while allowing the voice to pass through to the user via the speaker, and discontinuing the allowing the voice to pass through the speaker following an input command by the user. In one example, the threshold volume may be above or near the volume of a voice of a person talking in a conversational setting. In another example, the input command may be a head gesture or vocal input by the user. Alternatively, the input command may be a pre-determined time duration during which there is no detected voice above the threshold volume. Furthermore, a balance between a volume of the voice and a volume of the audio playback may be adjusted by the user of the headphone unit.

In an embodiment, a headphone unit may be provided, comprising: two speaker units with a headband spanning in between, an audio receiving device embedded in one of the speaker units, one or more accelerometers, a port to receive an input audio signal from an external audio device, and an ambient noise-detecting module including instructions executable for manipulating audio playback to a user of the headphone unit, comparing ambient noise to pre-determined sound, and executing multiple user-selectable modes for manipulating audio playback. Further, the audio receiving device may comprise a microphone or other component to record ambient noise. In one example, manipulating audio playback may comprise pausing audio playback or continuing audio playback uninterrupted. In another example, the input audio signal may produce audio playback directed through the two speaker units to the user of the headphone unit.

In another embodiment, a method for a headphone unit is provided, comprising: upon a user of the headphone unit selecting one of multiple always listening modes, executing the selected always listening mode, emitting sound to the user via one or more speakers of the headphone unit, and manipulating audio playback to the user upon completion of conditions of the selected always listening mode. In one example, the multiple always listening modes may be specific to different environments. In this way, different environments may outdoors, indoors, an office setting, a crowded room, or other environments that include different levels of ambient noise and number of people. In another example, conditions of the selected always listening mode may include detection of a pre-determined sound, detection of a sound above a threshold volume, detection of a voice above a threshold volume, or a combination thereof. Thus, the multiple always listening modes may include different sets of conditions.

It is to be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated may be performed in the sequence illustrated, in other sequences, in parallel, or in some cases omitted. Likewise, the order of the above-described processes may be changed.

The subject matter of the present disclosure includes all novel and non-obvious combinations and sub-combinations of the various processes, systems and configurations, and other features, functions, acts, and/or properties disclosed herein, as well as any and all equivalents thereof.

As used herein, an element or step recited in the singular and proceeded with the word "a" or "an" should be understood as not excluding plural of said elements or steps, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising," "including," or "having" an element or a plurality of elements having a particular property may include additional such elements not having that property. The terms "including" and "in which" are used as the plain-language equivalents of the respective terms "comprising" and "wherein." Moreover, the terms "first," "second," and "third," etc. are used merely as labels, and are not intended to impose numerical requirements or a particular positional order on their objects.

This written description uses examples to disclose the invention, including the best mode, and also to enable a person of ordinary skill in the relevant art to practice the invention, including making and using any devices or systems and performing any incorporated methods. The patentable scope of the invention is defined by the claims, and may include other examples that occur to those of ordinary skill in the art. Such other examples are intended to be within the scope of the claims if they have structural elements that do not differ from the literal language of the claims, or if they include equivalent structural elements with insubstantial differences from the literal languages of the claims.

The invention claimed is:

1. A method for an always listening function of an earpiece including a speaker unit, a processor and an audio receiving device, the method comprising the earpiece processor:
   analyzing ambient noise received by the audio receiving device and surrounding the earpiece; and
   upon detection of a pre-determined sound, performing the following steps:
      executing an alert to a user of the earpiece,
      receiving an input command from the user in response to the alert, the input command indicating whether to provide the ambient noise to the user,
      manipulating an audio playback of the earpiece by including the ambient noise in the audio playback if the input command indicates providing the ambient noise to the user, and
      reducing a volume of the ambient noise in the audio playback in response to a pre-determined time period during which there is no detection of the pre-determined sound.

2. The method of claim 1, wherein the pre-determined sound comprises a name of the user, a greeting, or a combination thereof.

3. The method of claim 1, wherein the alert is an adjustment to a power supplied to the earpiece.

4. The method of claim 1, wherein the input command is a head gesture of the user.

5. The method of claim 1, wherein the pre-determined sound comprises one or more of a siren, horn, or other sound that represents a danger to the user.

6. The method of claim 1, wherein manipulating the audio playback comprises pausing the audio playback or continuing the audio playback uninterrupted.

7. A method for an always listening function of an earpiece including a speaker unit, a processor and an audio receiving device, the method comprising the earpiece processor:
   analyzing ambient noise received by the audio receiving device and surrounding the earpiece; and
   upon detection of a voice above a threshold volume in the ambient noise, performing the following steps:
      allowing the voice to pass through the speaker unit to a user of the earpiece,
      simultaneously continuing audio playback through the speaker unit while allowing the voice to pass through to the user via the speaker unit, and
      reducing a volume of the ambient noise in the audio playback in response to a pre-determined time duration during which there is no detected voice above the threshold volume.

8. The method of claim 7, wherein the threshold volume is above or near the volume of a voice of a person talking in a conversational setting.

9. The method of claim 7, wherein the audio receiving device comprises a microphone.

10. The method of claim 7, wherein a balance between a volume of the voice and a volume of the audio playback is adjusted by the user of the earpiece.

11. An earpiece, comprising:
    a speaker unit;
    an audio receiving device;
    a port to receive an input audio signal from an external audio device; and
    a processor including instructions executable for analyzing ambient noise received by the audio receiving device and surrounding the earpiece, manipulating audio playback to a user of the earpiece by including the ambient noise in an audio playback through the speaker unit, comparing ambient noise to a pre-determined sound, and reducing a volume of the ambient noise in the audio playback in response to a pre-determined time duration during which there is no detection of the pre-determined sound.

12. The earpiece of claim 11, wherein the audio receiving device comprises a microphone or other component to record ambient noise.

13. The earpiece of claim 11, wherein manipulating audio playback comprises pausing audio playback or continuing audio playback uninterrupted.

14. The earpiece of claim 13, wherein the input audio signal produces the audio playback directed through the speaker unit to the user of the earpiece.

15. The earpiece of claim 11, wherein the audio receiving device is included on an exterior surface of the earpiece.

16. The earpiece of claim 11, wherein the earpiece is an ear bud.

17. A method for an earpiece including a speaker unit; a processor and an audio receiving device, the method comprising the earpiece processor:
    upon a user of the earpiece selecting one of multiple always listening modes, performing the following steps:
       emitting sound to the user via the speaker unit,
       executing an alert to a user of the earpiece,
       receiving an input command from the user in response to the alert, the input command indicating whether to provide an ambient noise to the user,
       comparing ambient noise to a pre-determined sound,
       manipulating an audio playback of the earpiece by including the ambient noise in the audio playback through the speaker unit if the input command indicates providing the ambient noise to the user, and reducing a volume of the ambient noise in the audio playback in response to a pre-determined time duration during which there is no detection of the pre-determined sound.

18. The method of claim 17, wherein each of the multiple always listening modes is specific to a different environment.

19. The method of claim 18, wherein the different environment includes one of an outdoor setting, an indoor setting, an office setting, a crowded room, and environments having different levels of ambient noise and number of people.

20. The method of claim 17, wherein each of the multiple always listening modes include a distinct set of conditions.

* * * * *